US010516396B2

(12) United States Patent
Coole et al.

(10) Patent No.: US 10,516,396 B2
(45) Date of Patent: Dec. 24, 2019

(54) OVERLAY ARCHITECTURE FOR PROGRAMMING FPGAS

(71) Applicant: University of Florida Research Foundation, Incorporated, Gainesville, FL (US)

(72) Inventors: James R. Coole, Gainesville, FL (US); Gregory M. Stitt, Gainesville, FL (US)

(73) Assignee: University of Florida Research Foundation, Incorporated, Gainesville, FL (US)

(*) Notice: Subject to any disclaimer, the term of this patent is extended or adjusted under 35 U.S.C. 154(b) by 18 days.

(21) Appl. No.: 15/582,342

(22) Filed: Apr. 28, 2017

(65) Prior Publication Data
US 2017/0317678 A1 Nov. 2, 2017

Related U.S. Application Data

(60) Provisional application No. 62/329,944, filed on Apr. 29, 2016.

(51) Int. Cl.
G06F 17/50 (2006.01)
G06F 13/40 (2006.01)
H03K 19/173 (2006.01)

(52) U.S. Cl.
CPC ... *H03K 19/17736* (2013.01); *G06F 13/4022* (2013.01); *H03K 19/1731* (2013.01); *H03K 19/17728* (2013.01)

(58) Field of Classification Search
USPC .................. 716/127–131, 110–118
See application file for complete search history.

(56) References Cited

U.S. PATENT DOCUMENTS

| 8,959,469 B2* | 2/2015 | Chen ................... G06F 17/5054 716/101 |
| 2005/0278684 A1* | 12/2005 | Hamilton ................. G06F 8/10 716/102 |
| 2010/0058261 A1* | 3/2010 | Markov .............. G06F 17/5045 716/106 |
| 2010/0283505 A1* | 11/2010 | Koch .................. G06F 15/7867 326/41 |
| 2011/0214100 A1* | 9/2011 | McElvain ........... G06F 17/5077 716/130 |
| 2012/0017186 A1* | 1/2012 | Amundson ......... G06F 17/5045 716/104 |
| 2012/0119782 A1* | 5/2012 | Madurawe ........ H01L 27/11807 326/47 |
| 2014/0189622 A1* | 7/2014 | Titley .................. G06F 17/5054 716/105 |

(Continued)

OTHER PUBLICATIONS

Brant et al., Zuma: An Open FPGA Overlay Architecture. Field-Programmable Custom Computing Machines (FCCM). 2012 IEEE 20th Annual International Symposium. Apr. 2012:93-6.

(Continued)

*Primary Examiner* — Binh C Tat
(74) *Attorney, Agent, or Firm* — Alston & Bird LLP

(57) ABSTRACT

An overlay architecture and an associated method that uses datapath merging to provide minimal-overhead support for multiple source netlists, and optionally provides an adjustable amount of flexibility through a secondary interconnect network is disclosed.

18 Claims, 4 Drawing Sheets

(56) References Cited

U.S. PATENT DOCUMENTS

2015/0007120 A1* 1/2015 Erickson ............ G06F 17/5054
716/105

OTHER PUBLICATIONS

Capalija et al., Towards Synthesis-Free JIT Compilation to Commodity FPGAS. Field-Programmable Custom Computing Machines (FCCM). 2011 IEEE 19$^{th}$ Annual International Symposium. May 2011:202-5.

Clos, A Study of Non-Blocking Switching Networks. Bell System Technical Journal. 1953:32(2):406-24.

Coole et al., Adjustable-Cost Overlays for Runtime Compilation. Field-Programmable Custom Computing Machines (FCCM). 2015 IEEE 23$^{rd}$ Annual International Symposium. 2015:21-24.

Coole et al., Fast, Flexible High-Level Synthesis from OpenCL Using Reconfiguration Contexts. Micro, IEEE 2014:24(1):42-53.

Coole et al., Intermediate Fabrics: Virtual Architectures for Circuit Portability and Fast Placement and Routing. CODES/ISSS '10: Proceedings of the IEEE/ACM/IFIP International Conference on Hardware/Software Codesign and System Synthesis. 2010:13-22.

Coole et al., OpenCL High-Level Synthesis for Mainstream FPGA Acceleration. Workshop on SocS, Heterogeneous Architectures and Workloads (SHAW). 2014. 6 pages.

Landy et al., A Low-Overhead Interconnect Architecture for Virtual Reconfigurable Fabrics. CASES' 12: Proceedings of the 2012 International Conference on Compilers, Architectures and Synthesis for Embedded Systems. 2012:111-9.

Lin, Nonblocking Routing Properties of Clos Networks. Advances in Switching Networks. Kluwer Academic Publishers. 2000. 25 pages.

Moreano et al., Efficient Datapath Merging for Partially Reconfigurable Architectures. Computer-Aided Design of Integrated Circuits and Systems. IEEE Transactions. 2005:24(7):969-80.

Mulpuri et al., Runtime and Quality Tradeoffs in FPGA Placement and Routing. Proceedings of the 2001 ACM/SIGDA Ninth International Symposium on Field Programmable Gate Arrays. 2001:29-36.

Munshi, The OpenCL Specification (version 1.2). Khronos Group 2012, 380 pages.

Pothineni et al., A High-level Synthesis Flow for Custom Instruction Set Extensions for Application-Specific Processors. Proceedings of the 2010 Asia and South Pacific Design Automation Conference. IEEE 2010:707-12.

Shukla et al., QUKU: A Two-Level Reconfigurable Architecture. Proceedings of the IEEE Computer Society Annual Symposium on Emerging VLSI Technologies and Architectures. IEEE Computer Society. 2006:109-114.

Singh et al., Harnessing the Power of FPGAs Using Altera's OpenCL Compiler. Proceedings of the ACM/SIGDA International Symposium on Field Programmable Gate Arrays. 2013:5-6. (We have confirmed with the RePrints Desk that page is blank and only an abstract exists.).

Stitt et al., Intermediate Fabrics: Virtual Architecture for Near-Instant FPGA Compilation. Embedded Systems Letters, IEEE. 2011:81-4.

Varma et al., Asymmetrical Multiconnection Three-Stage Clos Networks. Parallel Processing Symposium, IEEE. 1992:411-4.

* cited by examiner

OVERLAY ARCHITECTURE FOR PROGRAMMING FPGAS

RELATED APPLICATIONS

This application claims priority to and the benefit of U.S. Provisional Patent Application No. 62/329,944, filed Apr. 29, 2016. The entire contents of the foregoing are hereby incorporated herein by reference.

FEDERALLY SPONSORED RESEARCH

This invention was made with government support by the I/UCRC Program of the National Science Foundation under Grant No. EEC-0642422 and IIP-1161022. The government has certain rights in the invention.

BACKGROUND

Field-programmable gate arrays (FPGAs) have important advantages, but compilation consisting of full-detail synthesis, placement, and routing can require hours or even days, which is slow for some use cases and is a productivity bottleneck for many others. In addition, FPGA compilation is typically only computationally feasible on large machines, whereas compilers for graphics-processing units (GPUs) can run on small microprocessors even at runtime. It is desirable for FPGA systems to also be able to take advantage of the enhanced application portability, security, and target- and runtime-specific optimizations.

Specialized, coarse-grain virtual architectures (also known as overlays) can reduce the effort required for FPGA compilation by bringing the underlying fine-grain architecture of FPGAs up to the level of a given application, providing an abstraction over the FPGA. Because applications may change over time, either due to changing workloads or designer additions, or to handle optimizations introduced using runtime information, overlays should be flexible enough to support such changes to avoid the need to fall back to full-detail FPGA compilation. However, providing for this flexibility results in area overhead to include functional resources that aren't immediately used, or routing resources for connections that aren't immediately required. Therefore, there is a need to identify architectures that provide appropriate overhead and flexibility tradeoffs for the particular application when using overlays for FPGA design.

SUMMARY

According to some embodiments, a method of operating a computing device to generate, from a specification of functionality, a bitstream to program an FPGA is provided. The FPGA comprises a plurality of configurable logic elements and a plurality of configurable interconnection elements among the logic elements, and the bitstream specifies a configuration of at least a portion of the configurable logic elements and a portion of the configurable interconnection elements. The method comprises selecting an overlay from a library of a plurality of overlays. Each overlay defines a plurality of functional units and a plurality of configurable interconnects among the plurality of functional units, and programming information specifying, at least in part, a configuration of the FPGA to implement the plurality of functional units. The method also comprises generating, based on the specification of functionality, a defined configuration of the configurable interconnects that interconnects functional units of the plurality of functional units in accordance with the specification of functionality. The method further comprises generating, based on at least the defined configuration and the programming information of the selected overlay, a bitstream to configure the FPGA to implement functionality according to the specification of functionality.

According to some embodiments, at least one non-transitory computer-readable medium is provided. The non-transitory computer-readable medium is encoded with an overlay defining a plurality of functional units and a plurality of configurable interconnects among the plurality of functional units, and programming information specifying, at least in part, a configuration of an FPGA to implement the plurality of functional units and a configuration of the configurable interconnects. The non-transitory computer-readable medium is also encoded with computer executable instructions that, when executed, control at least one processor to perform a method of operating a computing device to generate, from a specification of functionality, a bitstream to program the FPGA, the FPGA comprising a plurality of configurable logic elements and a plurality of configurable interconnection elements among the logic elements, and the bitstream specifying a configuration of at least a portion of the configurable logic elements and a portion of the configurable interconnection elements. The method comprises generating, based on the specification of functionality, a defined configuration of the configurable interconnects that interconnects functional units of the plurality of functional units in accordance with the specification of functionality. The method also comprises generating, based on at least the defined configuration and the programming information of the selected overlay, a bitstream to configure the FPGA to implement functionality according to the specification of functionality.

According to some embodiments, a method of operating a computing device is provided to generate, from a specification of functionality, a bitstream to program an FPGA. The FPGA comprises a plurality of configurable logic elements and a plurality of configurable interconnection elements among the logic elements, and the bitstream specifies a configuration of at least a portion of the configurable logic elements and a portion of the configurable interconnection elements. The method comprises at a first time, generating a first bitstream representative of an overlay defining a plurality of functional units and a plurality of configurable interconnects among the plurality of functional units. The first bitstream comprises programming information for at least a portion of the configurable logic elements to implement the plurality of functional units. The method also comprises at a second time, generating a configuration for the plurality of configurable interconnects of the overlay based on the specification of functionality; and generating a second bitstream representative of the configuration for the plurality of configurable interconnects of the overlay. The second bitstream comprises programming information for at least a portion of the configurable interconnection elements to implement the plurality of configurable interconnects of the overlay. The method further comprises at a second time, programming the FPGA with the first bitstream and the second bitstream.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

1 Introduction

FPGA typically comprises a plurality of configurable logic elements and a plurality of configurable interconnection elements among the logic elements. An FPGA may be programmed based on a bitstream containing programming information for its logic elements and interconnection elements, during, for example, a field upgrade or an initial programming step at a manufacturer.

In order to address the challenge in using overlays for FPGA design as described in the background section, previous work on intermediate-fabrics introduced an overlay architecture incorporating an FPGA-like interconnect that provided good flexibility, but at a high area cost. A more recent approach reduced the expense of these overlays by generating multiple fabrics (i.e. reconfiguration contexts) specialized to the requirements of subsets of the system's kernels, while using a runtime framework to load the appropriate context into the FPGA on-demand. In some embodiments, the system's kernels define a specification of functionality for the system. Although this recent approach reduced area significantly through better functional resource sharing, it was limited by the sole use of a highly flexible, high-overhead interconnect. It is desirable that systems using custom overlays would also be able to tailor their interconnect for characteristics of the application, while still, and optionally, providing enough flexibility to handle deviation from their source set of netlists.

Disclosed here is a family of overlay architectures hereinafter referred to as "supersets", that consider similarities between the functional and communication requirements of subsets of source netlists. In some embodiments, the subsets of source netlists may be all kernels across the system's intended applications in an implementation for OpenCL.

Figure 1:
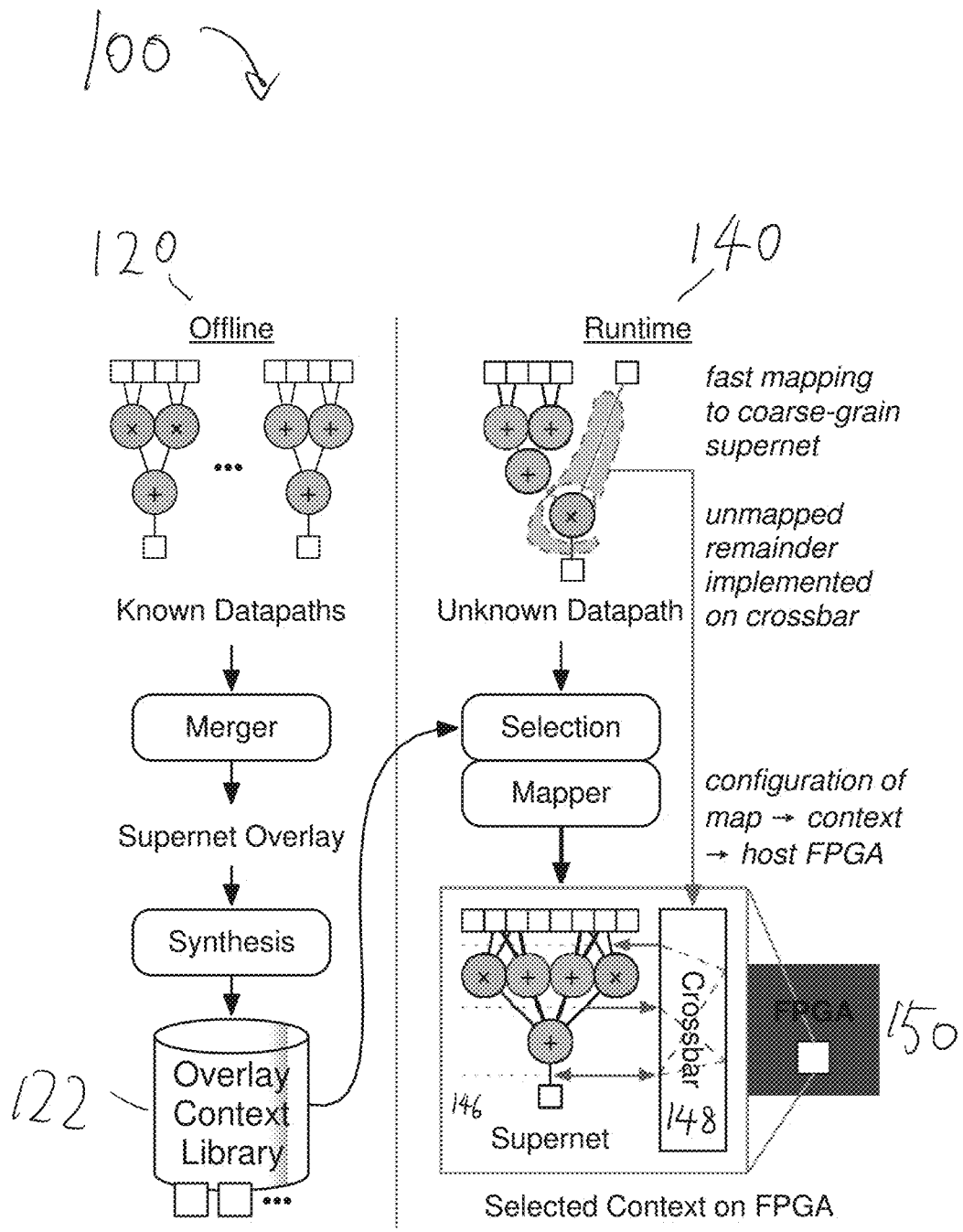
FIG. 1 is a diagram of an illustrative example embodiment showing offline and runtime tool flows for generating overlays (offline) and mapping an application onto overlays (runtime)

FIG. 1 is a diagram 100 of an illustrative example embodiment. The left column 120 shows an Offline scenario 120 where supernet design tools create a library 122 of coarse-grain reconfigurable overlay instances (contexts) to support groups of accelerator datapaths using datapath merging. In some embodiments, an overlay context may define one or more functional unit and one or more configurable interconnects among the functional units, as well as programming information specifying a configuration of FPGA 150 in order to implement the functional units defined in the overlay context. The resulting overlay includes this merged datapath supernet 146 and, optionally, a secondary network 148 (e.g., crossbar) to handle unanticipated connectivity. The right column of FIG. 1 shows a runtime scenario 140 where supernet mapping attempts to fit a new datapath to compatible supernets from the system's library, handling any missing connections using the crossbar 148. Though crossbar implementation is shown, it should be appreciated that any suitable architecture can be used in the example embodiment in FIG. 1.

As illustrated in the example in FIG. 1, an approach according to aspects of the present application uses offline tools to design overlay instances, hereinafter referred to as "contexts", for groups of similar source netlists, which may be stored in a library and shipped with the host system (or if the host device is known, with the application). At a later time, a runtime framework and compiler map clients' kernel source against contexts in this library, rather than directly to RTL implementations for the host's FPGA. In some embodiments, the mapping may be performed via standard OpenCL APIs, although it should be appreciated that any suitable high level programming language API may be used. In addition to enhancing application portability, this runtime compiler is free to introduce optimizations (e.g., kernel specialization) using data available only at runtime, as long as those changes are supported by the context library.

In some embodiments, the supernet architecture differs from previous context architectures by generating a tailored interconnect through datapath merging, reusing as many nets as possible between the source netlists to minimize interconnect area. In one example, by approximating the minimum interconnect required for a group of sources, supernets can map their source netlists with substantially lower overhead—up to 8.9× lower than minimum-sized intermediate-fabrics. In another example, the aggressive cross-function resource sharing enabled by this approach can save area (up to 70% in our experimental study as discussed in section 3.1 below) relative to traditional selectively enabled RTL datapaths.

Optionally, to support changes introduced by a designer or runtime optimizer, we may add flexibility to the basic supernet, which specifies a first portion of interconnection elements of the FPGA, through the addition of a secondary general-purpose m: n network spanning the supernet's functional resources that define a second portion of interconnection elements of the FPGA. By adjusting parameters of this secondary network, supernets have the advantage of enabling a wide range of overhead and flexibility tradeoffs that might be required for different scenarios, systems, and design goals. For example, during system development, being able to iterate and test on a physical FPGA might be of utmost importance, calling for a large amount of flexibility over area optimization. In a production system however, a designer might want to reduce device size and power requirements and make room for other static FPGA logic. The designer might desire enough flexibility to enable runtime optimizations. To explore these tradeoffs, we evaluate the flexibility afforded by various implementations of supernets' secondary network. We show in the sections below that an example implementation based on the three-stage Clos architecture provides significant freedom to increase area to support unanticipated connectivity. We additionally show that nonblocking configurations of Clos networks can be competitive with fabric networks.

2 Supernet Contexts

Disclosed in this section are the design and architecture of the supernet family of context architectures according to some aspects of the present application, including an FPGA overlay architecture based on datapath merging for kernel subgroups, with optional secondary networks to handle unanticipated connectivity. Section 2.1 describes how we design minimum-sized supernet-based overlays automatically from a collection of source netlists. Section 2.2 deals with adding flexibility and reconfigurability to these circuits through the addition of a secondary network. Finally, Section 2.3 describes mapping to and configuration of these architectures, as performed in the final stages of compilation in our OpenCL runtime compiler.

2.1 Supernet Design

Previous work on virtual overlays has considered coarse-grain analogues of traditional reconfigurable architectures, such as FPGAs and CGRAs. Because these architectures provide a very general-purpose interconnect, overlay design has focused principally on the functional resources to be included (e.g., multipliers, ALUs, simple processors).

Since real systems may require a variety of computational kernels with widely differing functional requirements, we address the challenges of functional selection through specialization by automatically creating separate overlay instances to cover subsets of related kernels used by the target system. In some embodiments, in our implementation for OpenCL, we refer to these input kernels as known (for an application) or anticipated kernels (for a larger application domain corpus). In some embodiments, functional clustering may be used to determine these subsets, and call the overlay instances created for each group of reconfiguration contexts. As illustrated in the example embodiment 100 in FIG. 1, libraries of contexts 122 are designed and synthesized offline and packaged either with the application or the target system. Later at runtime, kernels are compiled by a runtime framework before execution, which maps accelerator datapaths to contexts in these libraries, rather than to the underlying FPGA directly. In some embodiments, due to late binding, the application may be distributed as portable source without knowledge of the final target device, while the compiler remains free to implement dynamic and target-specific optimizations.

The functional clustering serves two purposes: it reduces context size relative to a single large context, and it encourages resource sharing between netlists under the assumption that only a single netlist will be active at a time. In some embodiments, an initial set of known kernels that must be supported is provided for supernet design (one at a time per context, though multiple contexts may be active on a single FPGA) by the resulting architecture. In addition to reusing functional resources, supernets may use a netlist merging heuristic to construct a near-minimum-sized interconnect by maximizing the reuse of nets across source netlists. The resulting overlays contain at least this skeleton of interconnects with overhead near the lower bound while supporting all known kernels. To provide additional flexibility, at the expense of additional area, the supernet family of architectures may add a general-purpose interconnect network attached to all operators. By adjusting the capacity of this network, a wide range of design points are available.

2.1.1 Netlist Merging Heuristic

According to some embodiments, given a set of n source datapaths, our design heuristic constructs a supernet overlay through a process of accretion: based on an initial seed datapath taken from the sources, datapaths are successively merged into the seed, with each iteration adding to the seed as few operators and nets as possible to accommodate the new netlist. Specifically, for n sources, the function merge is invoked n−1 times against the seed and all other sources. In general, the optimal ordering through the sources has not been determined, but the current implementation accumulates sources from largest to smallest.

According to some embodiments, each invocation of the function merge between the seed and an incoming source netlist attempts to match all nets in the incoming netlist against existing nets in the seed. Specifically, the function match attempts to establish a maximum-sized one-to-one net map from nets in the source to nets in the seed. When constructing this map, fanout in a netlist is split into bundles of single-sink nets, which are then mapped individually. The resulting net map is constrained so that the source and sink endpoints on either side of any net mapping connect compatible operators and ports. For example, a mapping from an incoming net $\langle +_1.C, \times_2.A \rangle$ to a seed net $\langle ALU_3.C, ALU_4.A \rangle$ implies two port mappings, which must both be legal for the mapping to be considered:

$+_1.C \rightarrow ALU_3.C$ and $\times_2.A \rightarrow ALU_4.A$

Further according to some embodiments, no two net mappings may be in conflict, which can happen in two ways: a net might be over-mapped (i.e. appearing twice within the pair), or the mappings may commit their endpoints' operators to inconsistent mappings (e.g., two mappings of nets in a bundle that would map their common source operator to two different operators in the seed).

Figure 2A:
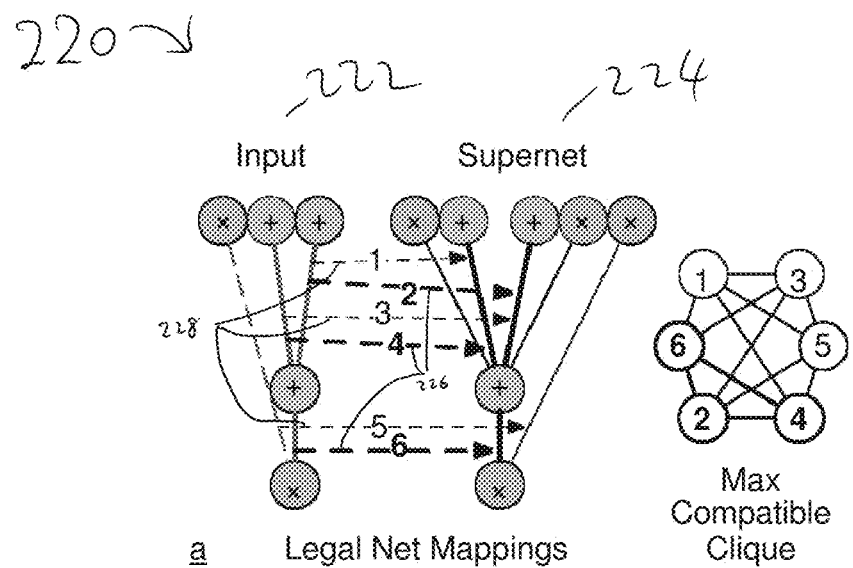
FIG. 2a and FIG. 2b are diagrams of several illustrative examples of some embodiments showing construction of supernets and, when the supernet does not provide sufficient routing, how to use a secondary network.
Figure 2B:
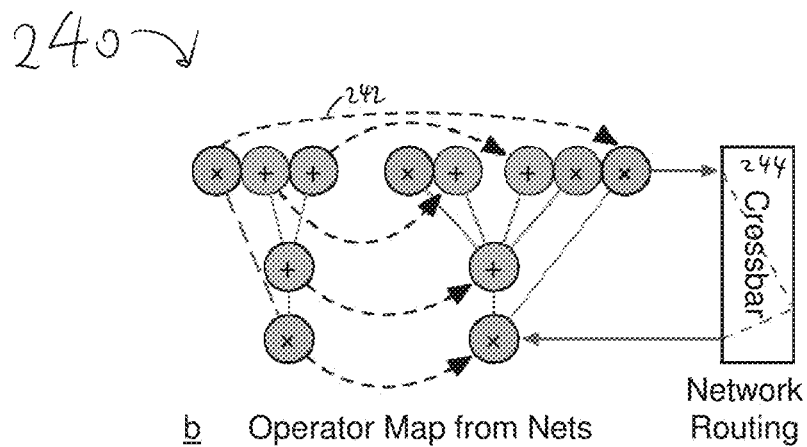

FIG. 2a and FIG. 2b are diagrams 220 and 240 of several illustrative examples of some embodiments. FIG. 2a shows an example 220 of match for an input netlist 222 and a supernet 224. Dashed lines 226, 228 show individually legal net map entries. A corresponding compatibility graph connects net mappings that are simultaneously legal. The final net map (bold 226 mapped, dash-dot 228 unmapped) is maximized by solving for a maximum clique on this diagram. FIG. 2b shows corresponding operator mappings 240 based on match's net map. The unmapped (dash-dot) net 242 is routed instead on the attached crossbar network 244, connecting the network ports attached during design to the corresponding operator ports.

In some embodiments, when determining the legality of a given net mapping, match considers multiple factors beyond equality to increase the chances of success. Cores (e.g., ALUs, LUTs) specified to the tools (typically once per device family) may specify runtime- and synthesis-properties (implemented as control ports and generics, respectively) that affect their behavior depending on an assignable value. For each net mapping, the values are compared for each operator pair and possibly adjusted to legalize the match. For runtime properties (e.g., an ALU's operation flag), mismatches are resolved during mapping (at runtime) by assigning the correct value to the corresponding port's attached configuration register. Mismatches in synthesis-properties (e.g., data width), may be resolved through promotion rules according to each core's specification. Nominal port mismatches (e.g., A vs. B) may also be resolved for cores declared as commutative.

In some embodiments, to maximize the size of the net mapping, our implementation of match uses Moreano's formulation of this problem as solving for the maximum clique on a net-compatibility graph. Specifically, match constructs a net-compatibility graph where each node represents a single individually legal mapping from a source net to a seed net: $\langle net_{input}, net_{supernet} \rangle$. An example of possible net mappings and the corresponding net compatibility graph 220 is shown in FIG. 2a. Edges in the graph represent pairs of net mappings that are simultaneously legal using the criteria described above (i.e. don't over-map a resource and don't imply conflicting operator mappings). The function match solves for the largest net map by finding a maximum clique on this graph, with all mappings in the clique included in the resulting net map.

This net map implies a corresponding operator map 240 that maps operators on either side on input nets to their supernet counterparts, as illustrated in FIG. 2b. Any operator in the input netlist 222 that doesn't appear in this map is assigned, at random, to a compatible free operator in the supernet 224. The resulting net and operator maps are returned by match.

According to some embodiments, during design, any nets or operators in the source that are not matched by match are cloned and inserted into the seed netlist. During this process, we may allow input ports to be overloaded by the addition of new nets, creating a temporarily illegal netlist. Alternatively or additionally, certain operator types may receive special treatment in the process. For example, because constant drivers are essentially interchangeable, they grow the compatibility graph significantly. As will be discussed in section 3.1.2 below, the resulting architecture may also implement constants indirectly and in a way that makes them available trivially on any operator input. Thus, constants are stripped before merge and reconstituted at the end of the design process. Because muxs and FIFOs also receive special implementation in the final architecture, they are similarly stripped and reconstituted.

2.1.2 Netlist Legalization

According to some embodiments, the output of the process described above may be an illegal netlist that can be transformed into one of the source netlists by 'activating' some subset of its nets and operators. The netlist is illegal because operator inputs may have been overloaded by nets inserted during design. In a post-processing step, we legalize these situations by inserting a mux before any overloaded input. In the case of subrange assignments, multiple muxs may be inserted over discrete slices of the input port. To allow a net to be 'activated' at runtime, the select lines of these muxs are exposed for configuration by declaring select as a runtime property (e.g., ALU's operation property).

In some embodiments, because net mapping ignores the timing of inputs in the input netlist, the supernet may need to adjust the delay experienced across each net based on its mapping. We legalize these situations by inserting adjustable-depth FIFOs (after any mux) on each operator input (with the FIFO's depth also exposed as a runtime property), as shown in FIG. 3b. These FIFOs are also used to inexpensively provide constant drivers for any operator input. Each FIFO includes constant-value and constant-enable runtime properties, which when enabled disables the FIFO's clock and resets to constant-value.

In some embodiments, the design tools may provide for the configurability of all runtime properties throughout the supernet by attaching registers to the corresponding ports, including operator flags (e.g., ALU operation), mux selects, and FIFO constants and depths. To enable fast configuration of all these properties after mapping, the registers are chained into n shift registers that are programmed by an n-bit parallel bitstream, where n is system- or user-specified (typically set by DMA memory bandwidth). The tools export the supernet as a VHDL project to vendor synthesis tools (e.g., Xilinx ISE), run vendor place & route, and save the resulting FPGA bitfile in the library with an internal representation of its contents. In some embodiments, per-target mapping may be specified in the core library, so that this process is portable between vendors and part families. Additionally, partial reconfiguration (PR) floorplans may be specified to confine contexts to a PR region. Later at runtime, the mapper (discussed in section 2.3 below) assigns values to runtime properties and serializes them in chaining order as a virtual bitstream, programmed on the context using an external deserializing DMA core.

2.2 Secondary Network

According to some embodiments, the minimal supernet architecture described in section 2.1 may provide support for all the known sources from which it was designed, with low overhead. However, other non-identical netlists are unlikely to be able to map to the supernet completely because little flexibility was retained. One important exception is that mapping is still possible for netlists that differ from the source set by only constants or, importantly, other configurable properties (e.g., ALU operator). In some embodiments the flexibility afforded by runtime properties could be used as a mechanism to improve a supernet's flexibility during design by forcing the supernet to use general-purpose operators (e.g., ALUs).

Figure 3A:
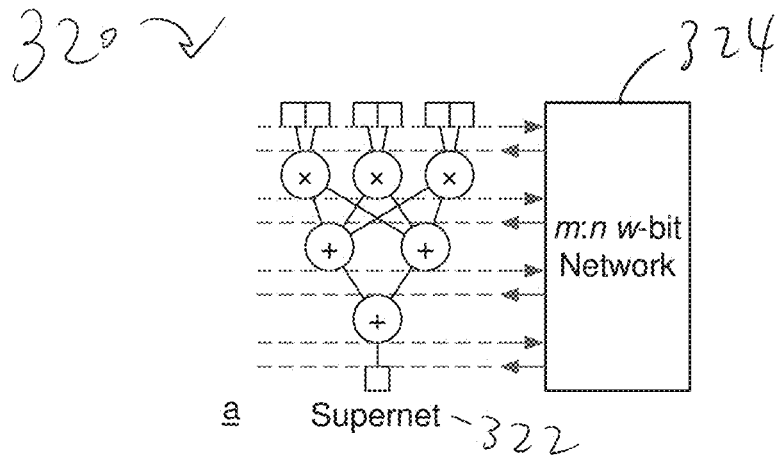
FIGS. 3a-3c are diagrams showing illustrative examples according to aspects of the present application.
Figure 3B:
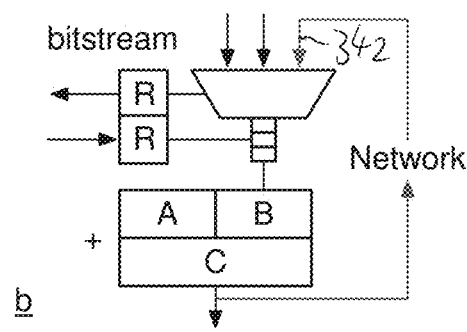
Figure 3C:
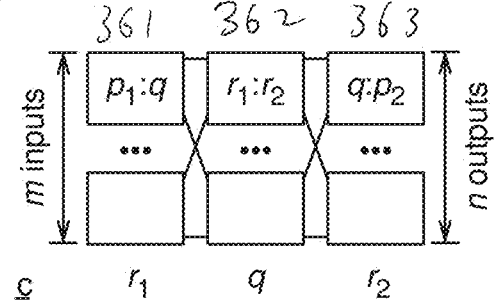

FIGS. 3a-3c are diagrams 320, 340, 360 showing illustrative examples according to aspects of the present application. FIG. 3a shows a supernet 322 attached to a secondary network 324, with m operator outputs and n operator inputs each attached to network inputs and outputs, respectively. FIG. 3b shows detail of an operator's input mux and FIFO, with an additional mux input 342 dedicated to network output and additional line of fanout for network input. FIG. 3c shows detail of one possible implementation of the secondary network: an asymmetric three-stage crossbar (i.e. Clos) network, with multiple smaller crossbars in each stage 361, 362, 363. Overhead and capacity may be adjustable based on architectural parameters.

According to some embodiments, to provide additional flexibility, at the expense of additional area, we may extend the basic supernet structure into a family of architectures through the addition of a secondary network 324, as shown in FIG. 3a. In this configuration, all inputs and outputs of each operator are connected to a secondary network, in addition to any connections created when the supernet was designed. During mapping, any connections required by the incoming netlist but not mapped directly on to the supernet may be routed on the secondary network, by configuring the sink port's input mux to receive data from the corresponding network output, and configuring the network to route data from the source port's corresponding network input. In some embodiments, the number of interconnection elements in the secondary network may be smaller than the number of interconnection elements represented by the supernet, in order to maintain the high speed and low overhead merits of the approach.

The network added to the supernet can be viewed as a blackbox entity with m inputs and n outputs, each w bits in width. Here, m is set by the number of outputs across all operators in the minimal supernet, n is the number of inputs across all operators, and w is the common bitwidth of all these signals. To handle circuits with mixed bitwidths (between non-promotable types, as in e.g., floating-point/fixed-point casting), the network can instead be designed with:

$w'=\gcd(w_1, w_2 \ldots)$ $m'=m_1 w_1/w'+m_2 w_2/w'+ \ldots$ $n'=n_1 w_1/w'+n_2 w_2/w'+ \ldots$ where $m_1$ is the number of operator inputs of width $w_1$, etc. In this case, each port wider than w' is split across multiple w'-wide network ports. Note that it is also possible to cover only part of the underlying supernet with network connectivity, which would reduce network size and overhead, at the expense of reducing flexibility for those regions not covered.

Though crossbar implementation is discussed, it should be appreciated that any suitable architecture can be used to implement the secondary network. The overhead incurred by adding this network depends on the implementation used. In general, the greater the capacity of the network, the greater the flexibility of the overlay to handle unanticipated connectivity. However, greater capacity typically requires additional switching logic (and state) and thus introduces overhead. Making this network optional, and general-purpose, represents a difference compared to existing overlays: supernets can provide a range of overhead and flexibility tradeoffs, adjustable based on the network's architectural parameters. The smoothness and range of this curve depends on the network architecture used, however the addition of any network introduces an increase in overhead due to the need for larger input muxs on operators, with an effect proportional to n.

In some embodiments, during mapping, any nets not handled by the underlying supernet may be instead handled by appropriately configuring the secondary network. Physically, configuration of the network is implemented by exposing its internal mux selects to the configuration chains discussed in legalization. To minimize clock overhead introduced by the network, networks may be internally pipelined. Consequently, routes through the network may experience multi-cycle routing delays, which are combined with the requirements of the input netlist to configure sink input FIFOs' depths.

2.3 Mapping

In some embodiments using supernets, a runtime framework (illustrated in the right column 140 of FIG. 1) serves requests for FPGA acceleration of kernel datapaths presented by user application(s). In our implementation, datapaths may be generated for these incoming kernels by a runtime OpenCL compiler. It should be appreciated that any suitable high level programming languages can be used as a source. In one example, this stage has a library of supernets generated offline as discussed in section 2.1 above and packaged with the target system or application. The runtime framework uses resource requirements to choose candidate supernet contexts from these libraries, and attempts to map the client's datapath to one of these candidates. When mapping is successful, the FPGA is configured with the context if not resident, and the context is configured for the map in turn.

According to some embodiments, the mapping problem for a supernet context may occur in two stages: supernet mapping and network routing. In one example, the secondary network has less capacity than the supernet itself to handle nets in the incoming datapath, so that an attempt is first made to use the supernet before the network.

In some embodiments, supernet mapping may be implemented using the same match procedure described in section 2.1.1, executed with the overlay's supernet (with the secondary network removed) and the incoming datapath as arguments. As during design, constants, muxs, and FIFOs are first stripped from both netlists and in this case reconstituted in later stages. The function match provides a mapping between nets and operators in the incoming datapath netlist and the candidate supernet. If operators in the datapath aren't handled in this map, there is no recourse (the network doesn't contain operators) and mapping fails. Any operators in the supernet not appearing in this map can be disabled (e.g., clock-gated) to save power. Constant drivers that were stripped before match are reconstituted by mapping them to their sinks' input FIFOs (as discussed in section 2.1.1).

In some embodiments, network routing is performed to configure the network to handle any nets in the datapath that don't appear in match's net map. For each unmapped net in the datapath, the operator map is used to find a pair of network ports corresponding to the net's source and sink operator ports. For example, for a missing net $\langle +_1.C, x_2.A \rangle$ the corresponding network ports are determined based on the operator map:

$+_1.C \to ALU_3.C \to input_i$ and $x_2.A \to ALU_4.A \to output_j$.

The input mux of each such sink may be first configured to accept data from its network output. Then, a list of all such port pairs are provided to a network-specific configuration procedure. Depending on the network chosen, the implementation can be very simple. For example, for a monolithic m: n crossbar, this information directly determines the select values of each of n internal muxs. For other network topologies, known implementations may be used, including network-flow decomposition for multi-stage crossbar networks. If the network cannot satisfy all the provided connections simultaneously, mapping as a whole fails. When mapping succeeds, the network's internal muxs (or other logic) are configured appropriately by assigning values to their select properties. The output of network routing is a map from nets in the datapath to the delay, in cycles through the network.

In some embodiments, before the context's bitstream can be exported from the mapper, each operator appearing in the operator map must be configured to match its corresponding datapath operator. This configuration is performed by first assigning appropriate values for each runtime property based on the operator map. Similarly, muxs' select properties are configured by assigning values to activate nets appearing on the right-hand side of the net map. FIFO depths are configured based on the input datapath and network routing's timing information. Finally, the mapper constructs a serialized bitstream for the entire context by reading the assigned value of each runtime property and writing them out in register chaining order (determined at design time and included in the library).

3 Experiments

To understand how supernet overlays constructed according to some embodiments in the present application compare with other approaches to synthesis, we evaluate an example supernet overlay against two other architectures for multi-kernel applications: selectively enabled datapaths and intermediate-fabrics. Selectively enabled datapaths are a common approach that directly implements accelerators for multiple kernels, and represents a low-overhead and low-flexibility implementation of a context. Intermediate-fabrics are an overlay architecture that achieves high flexibility at the expense of high overhead.

3.1 Case Study Comparison

Table 1 presents results from a case study system of 10 fixed- and floating-point (FLT) OpenCL image-processing kernels, comparing overhead and compilation times using 5 minimum-sized instances of two context architectures: supernets and intermediate-fabrics (Fabric), and directly implemented (Selectively Enabled RTL) kernel datapaths.

TABLE 1

| Kernel | Supernet Desktop Time | Clock (Nominal) | Area (% LUTs) | Fabric Desktop Time | Area (% LUTs) | Selectively Enabled (RTL) Desktop Time | Clock | Area (% LUTs) | Speedup Desktop Time | Overhead Clock | Area |
|---|---|---|---|---|---|---|---|---|---|---|---|
| FIR 16 tap | 0.21 s | | | 0.21 s | | 177 s | 410 MHz | | 859x | 36.6% | |
| Gaussian 4 × 4 | 0.20 s | | | 0.31 s | | 195 s | 410 MHz | | 997x | 36.6% | |
| Sobel 3 × 3 | 0.28 s | 260 MHz | 1.5% | 0.30 s | 13.4% | 189 s | 410 MHz | 0.9% | 680x | 36.6% | 1.6x |
| Kernel average | 0.23 s | | | 0.27 s | | 187 s | 410 MHz | | 845x | 36.6% | |
| Context 1 total | 0.68 s | | | 0.82 s | | 561 s | | | 826x | | |
| Bilinear | 0.02 s | | | 0.06 s | | 1874 s | 359 MHz | | 123.416x | 23.1% | |
| Mean 4 × 4 | 0.05 s | | | 0.15 s | | 973 s | 335 MHz | | 19.739x | 17.6% | |
| Threshold 4 × 4 | 0.05 s | 276 MHz | 1.9% | 0.15 s | 10.8% | 2166 s | 315 MHz | 2.8% | 42.933x | 12.4% | 0.7x |
| Kernel average | 0.04 s | | | 0.12 s | | 1671 s | 337 MH2 | | 62.030x | 17.7% | |
| Context 2 total | 0.11 s | | | 0.36 s | | 5013 s | | | 43.619x | | |
| Max 4 × 4 | 0.06 s | | | 0.10 s | | 220 s | 298 MHz | | 3.556x | 10.7% | |
| Min 4 × 4 | 0.06 s | | | 0.11 s | | 215 s | 293 MHZ | | 3.403x | 9.0% | |
| Normalize 3 × 3 | 0.10 s | | | 0.12 s | | 1841 s | 286 MHz | | 18.978x | 6.8% | |
| SAD 3 × 3 | 0.08 s | 266 MHz | 5.1% | 0.15 s | 16.2% | 184 s | 507 MHz | 5.9% | 2.371x | 47.4% | 0.9x |
| Kernel average | 0.07 s | | | 0.12 s | | 615 s | 346 MHz | | 7.077x | 18.5% | |
| Context 3 total | 0.30 s | | | 0.48 s | | 2460 s | | | 8.208x | | |
| FIR 16 tap FLT | 0.25 s | | | 0.19 s | | 553 s | 356 MHz | | 2.254x | 11.6% | |
| Gaussian 4 × 4 FLT | 0.25 s | | | 0.25 s | | 560 s | 356 MHz | | 2.209x | 11.6% | |
| Sobel 3 × 3 FLT | 0.29 s | 315 MHz | 15.3% | 0.12 s | 40.4% | 587 s | 356 MHz | 27.9% | 2.016x | 11.6% | 0.5x |
| Kernel average | 0.26 s | | | 0.18 s | | 566 s | 356 MHz | | 2.160x | 11.6% | |
| Context 4 total | 0.79 s | | | 0.55 s | | 1699 s | | | 2.152x | | |
| Bilinear FLT | 0.02 s | | | 0.07 s | | 302 s | 356 MHz | | 14.764x | 7.5% | |
| Mean 4 × 4 FLT | 0.08 s | | | 0.16 s | | 425 s | 356 MHz | | 5.190x | 7.5% | |
| Threshold 4 × 4 FLT | 0.10 s | | | 0.16 s | | 454 s | 356 MHz | | 4.508x | 7.5% | |
| Max 4 × 4 FLT | 0.08 s | | | 0.10 s | | 447 s | 356 MHz | | 5.920x | 7.5% | |
| Min 4 × 4 FLT | 0.08 s | 329 MHz | 14.6% | 0.10 s | 48.0% | 462 s | 356 MHz | 48.1% | 6.153x | 7.5% | 0.3x |
| Normalize 3 × 3 FLT | 0.11 s | | | 0.11 s | | 539 s | 356 MHz | | 4.935x | 7.5% | |
| SAD 3 × 3 FLT | 0.09 s | | | 0.14 s | | 474 s | 356 MHz | | 5.247x | 7.5% | |
| Kernel average | 0.08 s | | | 0.12 s | | 445 s | 356 MHz | | 6.674x | 7.5% | |
| Context 5 total | 0.55 s | | | 0.86 s | | 3102 s | | | 5.610x | | |
| Kernel average | 0.12 s | | 7.7% | 0.15 s | 25.8% | 642 s | | 17.1% | 13.506x | 16.7% | |
| System total | 2.44 s | | 35.4% | 3.05 s | 128.8% | 12835 s | | 85.7% | 5.267x | | 0.4x |

Our first set of experiments evaluate the total compilation time (synthesis and mapping through to the target device) and minimum overhead of three different context architectures: supernets, intermediate-fabrics, and selectively enabled datapaths. For this analysis, we use a case study computer-vision framework based on, including fixed- (FXD) and floating-point (FLT) versions of 10 OpenCL kernels for image processing. The tools were directed to group the source kernels into five clusters, creating context implementations for each cluster.

We compare the area and clock achieved by each of the overlays against the area and clock achieved for the source kernels implemented directly on the FPGA. For this selectively enabled datapath implementation, the runtimes presented are offline implementation times through the vendor tools (from VHDL). Because selectively enabled datapaths typically support only enumerated 'known' kernels, and are implemented using static selective-enabling logic, the runtime work is negligible. Note that although supernet mapping could theoretically be reused to match new kernels against selectively enabled datapath contexts, the likelihood of a successful map for anything other than a known kernel would probably be impractically low. For the context architectures, we minimize overhead at the expense of flexibility, by minimizing track count for each fabric, and not using a secondary network for each supernet.

Table 1 gives the results of this comparison for a Xilinx Virtex 6 xc6vcx130t-1ff1154 FPGA. PlanAhead 14.7 was used to implement all overlays on the FPGA, from VHDL designed and exported by our tools, without a floorplan. For each overlay type (i.e. Supernet and Fabric), Desktop Time gives the execution time in seconds required for all stages of (runtime) compilation, including OpenCL synthesis and virtual bitstream generation—though these times are dominated by overlay-specific mapping (i.e. place & route for Fabric). Desktop times are given for our C-based runtime compiler and PlanAhead 14.7, run on the same quad-core 2.66 GHz Intel Xeon W3520 workstation with 12 GB RAM, and the resulting compilation speedup is given in Speedup.

Per-kernel compilation times averaged 0.12 s for the supernet contexts, and are comparable to the per-kernel times for fabric contexts. Individually, these times were on average 13,000× faster than direct implementation using vendor tools. Collectively, the system of kernels compiled in 2.5 s, compared to 3.5 hours for the vendor tools. These significantly faster compile times were achieved due to the overlays' ability to hide the low-level implementation details of coarse-grain operators (e.g., internal subnetlists of LUTs) from the synthesis and mapping phases of compilation, significantly reducing problem size. One important consequence of enabling runtime compilation is that it significantly improves application portability by allowing applications to build their accelerators from portable kernel source (or intermediate representation) after they've been deployed on a host, using contexts the host system provides. For example, in our implementation of the OpenCL API, applications embed standard OpenCL kernel source and compile this source once for each target device discovered at runtime (via the same clBuildKernel( ) API used by GPUs and CPUs). The compiler itself is also portable across device vendors and families, benefiting from these same context (and core library) abstractions.

The Clock (Nominal) column in Table 1 gives the $f_{max}$ reported by (offline) implementation using vendor tools for each context instance, which nominally sets the frequency of any netlist mapped to the context, including all source kernels. The Area (% LUTs) column gives the area of each context instance as a percentage of the total number of lookup tables (LUTs) in the FPGA. We present area in terms of LUTs as this is the most heavily utilized resource, across all the context architectures considered, and generally tracks register utilization, which has the next highest utilization. LUTs are also most affected by logic contributing to context flexibility (e.g., muxs). While each architecture also makes use of DSP and memory primitives within its operators, these resources are actually used less heavily by the two overlays due to aggressive functional resource sharing, making a LUT-based measure of overhead somewhat pessimistic in how it reflects these other resources.

For each kernel, the Clock Overhead column compares per-kernel clocks of direct implementations against the clock achieved by the same kernel hosted on its overlay context. The average clock overhead for supernet contexts was 16.2%, but varied across contexts and kernels. One cause of significant clock overhead can be variation between the $f_{max}$ of different operator types. When clustering places slow and fast operators in the same context, the slower operators set the context's overall clock, and thus the speed for any netlist implemented on that context—even when the netlist doesn't use the slower operator (e.g., SAD was slowed when implemented on Context 3).

The Area Overhead column compares the area of the selectively enabled datapath contexts (source kernels implemented in parallel) against the two overlay architectures. The different context implementations demonstrate different tradeoffs. On average, the supernet contexts had 60% lower area relative to the selectively enabled datapaths. This area reduction was a result of the supernets' functional resource sharing, which had more pronounced effects for the larger floating-point operators (e.g., Clusters 4-5 vs 1-3). Relative to intermediate-fabrics, supernets could achieve a lower minimum overhead, ranging from 2.6× to 8.9×. Because both overlays perform similar functional resource sharing, this difference shows the greater ability of supernets to tailor their interconnect based on knowledge of the source kernels, trading flexibility for lower minimum area.

3.2 Area and Flexibility Tradeoffs

To support mapping netlists other than those known at context generation, supernet contexts may rely on additional routing capacity provided by a secondary network as described in section 2.2 (illustrated in FIG. 3). In this example we limit our evaluation to monolithic crossbars and three-stage crossbar (i.e. Clos) networks, in addition to fabrics, although any m:n network can be used to implement the secondary network.

The family of three-stage asymmetric Clos networks illustrated in FIG. 3c provides circuit switching between m inputs and n outputs via three separate stages with multiple smaller crossbars in each stage. The first, or ingress, stage consists of $r_1$ instances of $p_1$:q crossbars where $m \le p_1 r_1$, with inputs at this stage providing the network's inputs. Similarly, the final, or egress stage consists of $r_2$ instances of q:$p_2$ crossbars where $n \le p_2 r_2$, with these outputs providing the network's outputs. The ingress and egress stages are joined by a middle stage of q $r_1$:$r_2$ crossbars, with inputs connected to the ingress stage's outputs and outputs connected to the egress stage's inputs. Clos networks are attractive as an implementation of supernets' secondary network because of their large design space, providing a total of five architectural parameters: q, $p_1$, $r_1$, $p_2$, $r_2$.

Figure 4:
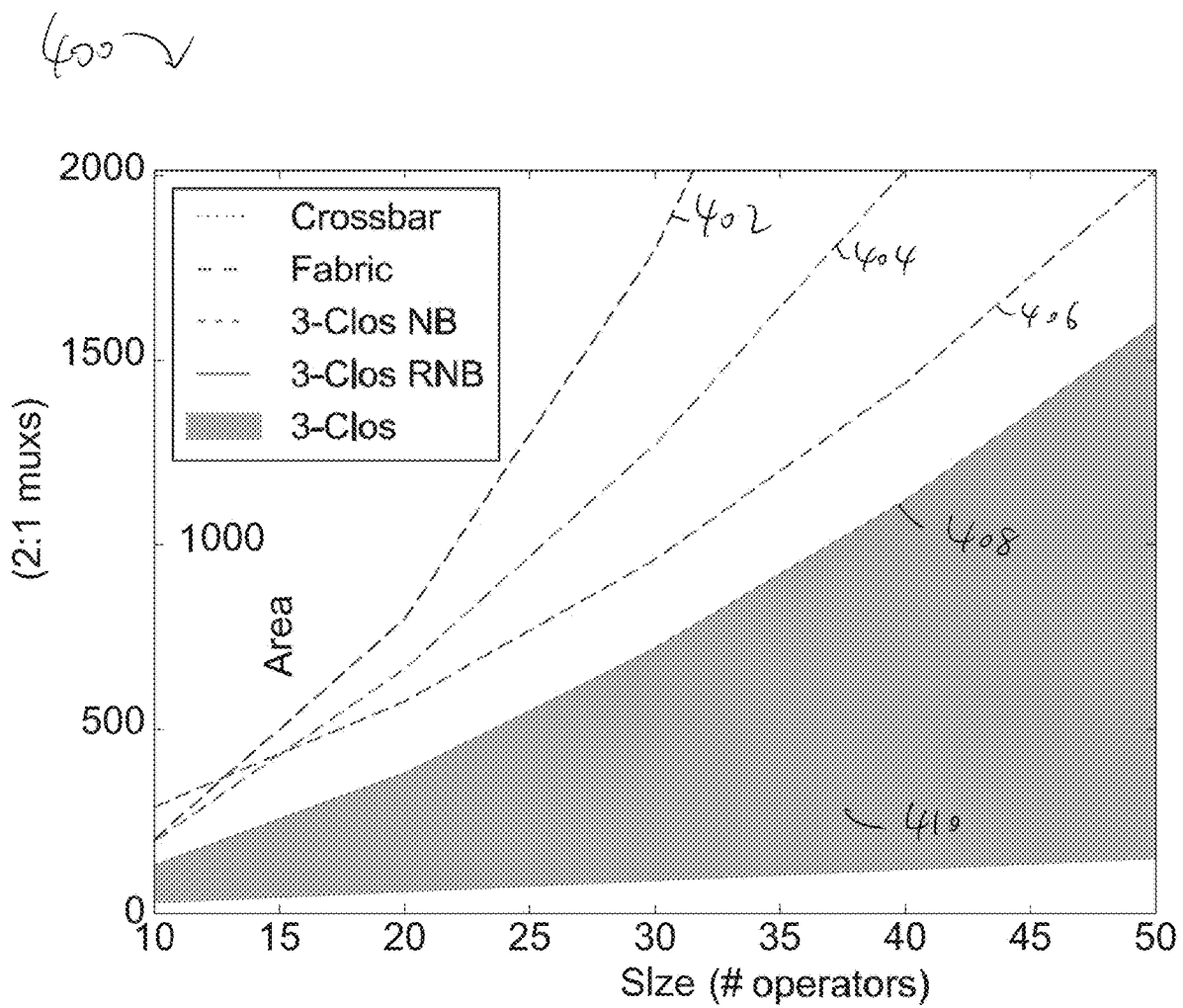
FIG. 4 is a data plot showing experimental comparison of secondary network area overhead for different implementations.

FIG. 4 is a data plot 400 showing comparison of secondary network area overhead (factored as 2:1 muxs) for different implementations, using a monolithic crossbar as a baseline. High-flexibility instances of three-stage Clos networks (near RNB) are competitive with Fabrics. Area bounds for the range of configurations of 3-Clos networks (shaded area) illustrate the wide range of overhead and flexibility tradeoffs possible.

The data plot in FIG. 4 evaluates three different architectures for the secondary network: a monolithic crossbar 402 (Crossbar), three-stage Clos networks 410 (3-Clos ...), and a 4 track (2 track each direction) routing-only fabric 406 (Fabric). For the monolithic crossbar, we evaluate a direct implementation consisting of n m:1 muxs. Similarly, we implement the Clos networks' internal crossbars using muxs, and permit single-source crossbars (e.g., $p_1$=1) by substituting wires.

Because network size and area, grows with the total number of operator ports in the underlying supernet, and these port counts depend in turn on the operator mix, we evaluate each architecture at different sizes by using different counts of uniformly 2:1 operators (e.g., an adder). For the fabric network, which is scaled in two dimensions, we approximate a square aspect ratio. Each of these network instances is then factored similarly into pipelines of 2:1 muxs, with the total count of these muxs providing a bitwidth- and device-independent measure of area, while also ensuring similar pipelining across architectures. Note that in practice, the granularity of this factorization should be set based on properties of the device family being used.

FIG. 4 shows two sets of Clos networks that include area-minimized instances for two conditions: strict-sense nonblocking 404 (3-Clos NB), with $q=p_1+p_2-1$, and rearrangeably nonblocking 408 (3-Clos RNB), with $q=\max(p_1, p_2)$. These present two extreme points in the Clos design space favoring flexibility over area, with each permitting simultaneous connections between any non-overlapping input/output pairs (assuming an offline algorithm, as during network routing, for the latter). Note that both sets can be synthesized using fewer muxs than a crossbar implementation, and that the RNB Clos network is competitive in area with fabric networks.

Because we expect supernet overlays will typically be used to map datapaths similar to those from which they're designed, the supernet itself should frequently handle the majority of routing, reducing the need for flexibility in the secondary network. The shaded region in flexibility (3-Clos) presents area bounds for three-stage Clos networks, found using an exhaustive search of architectural parameters below the RNB upper bound. This region is densely populated, illustrating that Clos networks provide significant freedom to trade flexibility for area, depending on use case or designer intent. The lower bound of this region is set by the need to increase overloading of operators' inputs, as shown in FIG. 3b, and grows with supernet size.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage.

Some embodiments may not implement any features described as advantageous herein and in some instances one or more of the described features may be implemented to achieve further embodiments. Accordingly, the foregoing description and drawings are by way of example only.

The above-described embodiments of the present invention can be implemented in any of numerous ways. The embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component, including commercially available integrated circuit components known in the art by names such as CPU chips, GPU chips, microprocessor, microcontroller, or co-processor. Alternatively, a processor may be implemented in custom circuitry, such as an ASIC, or semicustom circuitry resulting from configuring a programmable logic device. As yet a further alternative, a processor may be a portion of a larger circuit or semiconductor device, whether commercially available, semi-custom or custom. As a specific example, some commercially available microprocessors have multiple cores such that one or a subset of those cores may constitute a processor. Though, a processor may be implemented using circuitry in any suitable format.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format. In the embodiment illustrated, the input/output devices are illustrated as physically separate from the computing device. In some embodiments, however, the input and/or output devices may be physically integrated into the same unit as the processor or other elements of the computing device. For example, a keyboard might be implemented as a soft keyboard on a touch screen. Alternatively, the input/output devices may be entirely disconnected from the computing device, and functionally integrated through a wireless connection.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the invention may be embodied as a computer readable storage medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other tangible computer storage medium) encoded with one or more programs that, when executed on one or more computers or other processors, perform methods that implement the various embodiments of the invention discussed above. As is apparent from the foregoing examples, a computer readable storage medium may retain information for a sufficient time to provide computer-executable instructions in a non-transitory form. Such a computer readable storage medium or media can be transportable, such that the program or programs stored thereon can be loaded onto one or more different computers or other processors to implement various aspects of the present invention as discussed above. As used herein, the term "computer-readable storage medium" encompasses only a computer-readable medium that can be considered to be a manufacture (i.e., article of manufacture) or a machine. Alternatively or additionally, the invention may be embodied as a computer readable medium other than a computer-readable storage medium, such as a propagating signal.

The terms "code", "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed:

1. A method of generating an overlay architecture configured to compile a field programmable gate array, the method comprising:
   detecting a first match between a first logic block defined by a first received netlist and a first one of a plurality of logic blocks forming the overlay, wherein the overlay defines a first supernet comprising a first plurality of netlists each associated with a different one of the plurality of logic blocks, and wherein the detection of the first match is performed by maximizing a number of matches between nets defined by the first received netlist and nets defined by the first supernet based at least in part on a net-compatibility graph between the first received netlist and the first supernet;
   merging the first received netlist to the first supernet, wherein the merging comprises mapping the first logic block to the first one of the plurality of logic blocks, wherein the number of logic blocks in the first supernet remains unchanged before and after the mapping, and wherein the first supernet supports the first received netlist after the merging
   generating a second overlay defined by a second supernet comprising a second plurality of netlists each associated with a different one of a second plurality of logic blocks forming the second overlay;
   determining that the first and second supernets are related computational kernels by applying a clustering algorithm to the first and second supernets;
   and merging the first and second supernets.

2. The method of claim 1, further comprising:
   detecting whether a second match exists between a second logic block defined by a second received netlist and any one of the plurality of logic blocks; and
   merging the second received netlist to the first supernet by one of:
   mapping the second logic block to a second one of the plurality of logic blocks, or inserting the second logic block into the first supernet.

3. The method of claim 2, further comprising:
   receiving a first connectivity information defining a plurality of connections between the first and second logic blocks; and
   upon detecting that a third match does not exist between the first connectivity information and a second connectivity information associated with the first and second ones of the plurality of logic blocks, defining a routing network between the first and second ones of the plurality logic blocks in the overlay, wherein said routing network provides a plurality of connections between the first and second ones of the plurality logic blocks in accordance with the first connectivity information.

4. The method of claim 3, wherein said routing network comprises a crossbar switch.

5. The method of claim 1, wherein said first supernet is defined by a behavioral description language.

6. The method of claim 5, wherein said behavioral description language is synthesizable.

7. The method of claim 2, wherein the second logic block is mapped to a second one of the plurality of logic blocks if the second match is detected.

8. The method of claim 2, wherein the second logic block is inserted into the first supernet if the second match is not detected.

9. The method of claim 2, wherein the overlay is a virtual architecture comprising:
a plurality of functional units;
a plurality of configurable interconnects among the plurality of functional units; and
programming information specifying, at least in part, a configuration of the field programmable gate array to implement the plurality of functional units.

10. The method of claim 2, wherein each netlist of the first plurality of netlists represents a computational kernel providing a unique function, and at least two netlists of the first plurality of netlists share at least one logic block defined in the overlay.

11. An apparatus for generating an overlay architecture configured to compile a field programmable gate array, the apparatus comprising at least one processor and at least one memory storing instructions that, with the at least one processor, cause the apparatus to:
detect a first match between a first logic block defined by a first received netlist and a first one of a plurality of logic blocks forming the overlay, wherein the overlay defines a first supernet comprising a first plurality of netlists each associated with a different one of the plurality of logic blocks, and wherein the detection of the first match is performed by maximizing a number of matches between nets defined by the first received netlist and nets defined by the first supernet based at least in part on a net-compatibility graph between the first received netlist and the first supernet;
merge the first received netlist to the first supernet, wherein the merging comprises mapping the first logic block to the first one of the plurality of logic blocks, wherein the number of logic blocks in the first supernet remains unchanged before and after the mapping, and wherein the first supernet supports the first received netlist after the merging
generating a second overlay defined by a second supernet comprising a second plurality of netlists each associated with a different one of a second plurality of logic blocks forming the second overlay;
determining that the first and second supernets are related computational kernels by applying a clustering algorithm to the first and second supernets;
and merging the first and second supernets.

12. The apparatus of claim 11, wherein the at least one processor and the at least one memory storing instructions that, with the at least one processor, further cause the apparatus to:
detect whether a second match exists between a second logic block defined by a second received netlist and any one of the plurality of logic blocks; and
merge the second received netlist to the first supernet by one of:
mapping the second logic block to a second one of the plurality of logic blocks, or
inserting the second logic block into the first supernet.

13. The apparatus of claim 11, wherein the at least one processor and the at least one memory storing instructions that, with the at least one processor, further cause the apparatus to:
receive a first connectivity information defining a plurality of connections between the first and second logic blocks; and
upon detecting that a third match does not exist between the first connectivity information and a second connectivity information associated with the first and second ones of the plurality of logic blocks, define a routing network between the first and second ones of the plurality logic blocks in the overlay, wherein said routing network provides a plurality of connections between the first and second ones of the plurality logic blocks in accordance with the first connectivity information.

14. The apparatus of claim 11, wherein said first supernet is defined by a behavioral description language.

15. The apparatus of claim 14, wherein said behavioral description language is synthesizable.

16. The apparatus of claim 11, wherein the second logic block is mapped to a second one of the plurality of logic blocks if the second match is detected.

17. The apparatus of claim 11, wherein the second logic block is inserted into the first supernet if the second match is not detected.

18. A computer program product for generating an overlay architecture configured to compile a field programmable gate array, the computer program product comprising at least one non-transitory computer-readable storage medium having computer-readable program code portions stored therein, the computer-readable program code portions comprising an executable portion configured to:
detect a first match between a first logic block defined by a first received netlist and a first one of a plurality of logic blocks forming the overlay, wherein the overlay defines a first supernet comprising a first plurality of netlists each associated with a different one of the plurality of logic blocks, and wherein the detection of the first match is performed by maximizing a number of matches between nets defined by the first received netlist and nets defined by the first supernet based at least in part on a net-compatibility graph between the first received netlist and the first supernet;
merge the first received netlist to the first supernet, wherein the merging comprises mapping the first logic block to the first one of the plurality of logic blocks, wherein the number of logic blocks in the first supernet remains unchanged before and after the mapping, and wherein the first supernet supports the first received netlist after the merging
generating a second overlay defined by a second supernet comprising a second plurality of netlists each associated with a different one of a second plurality of logic blocks forming the second overlay;
determining that the first and second supernets are related computational kernels by applying a clustering algorithm to the first and second supernets;
and merging the first and second supernets.

* * * * *